(12) United States Patent
Chen

(10) Patent No.: US 9,574,768 B2
(45) Date of Patent: Feb. 21, 2017

(54) FUEL OIL PROVISION-VAPORIZATION-PRESSURE REGULATION-FULL PREMIXED COMBUSTION SYSTEM, THERMOELECTRIC POWER GENERATING DEVICE COMPRISING SUCH SYSTEM AND METHOD

(71) Applicant: Guangning Chen, Jiangsu (CN)

(72) Inventor: Guangning Chen, Jiangsu (CN)

( * ) Notice: Subject to any disclaimer, the term of this patent is extended or adjusted under 35 U.S.C. 154(b) by 0 days.

(21) Appl. No.: 14/916,028

(22) PCT Filed: Sep. 1, 2014

(86) PCT No.: PCT/CN2014/085651
§ 371 (c)(1),
(2) Date: Mar. 2, 2016

(87) PCT Pub. No.: WO2015/032295
PCT Pub. Date: Mar. 12, 2015

(65) Prior Publication Data
US 2016/0195267 A1  Jul. 7, 2016

(30) Foreign Application Priority Data

Sep. 4, 2013 (CN) .......................... 2013 1 0398351

(51) Int. Cl.
*F02B 51/02* (2006.01)
*F23D 11/44* (2006.01)
(Continued)

(52) U.S. Cl.
CPC ............. *F23D 11/441* (2013.01); *F23D 14/02* (2013.01); *F23K 5/22* (2013.01); *H01L 35/30* (2013.01);
(Continued)

(58) Field of Classification Search
CPC .... F23D 11/41; F23D 14/02; F23D 2203/105; F23D 2212/201; F23K 5/22; F23K 2900/1303; H01L 35/30
See application file for complete search history.

(56) References Cited

U.S. PATENT DOCUMENTS

2003/0084858 A1\* 5/2003 Kracklauer ............. F02B 23/00
123/1 A

FOREIGN PATENT DOCUMENTS

CN  1062594  7/1992
CN  2786444  6/2006
(Continued)

OTHER PUBLICATIONS

International Search Report filed in PCT/CN2014/085651 mailed Dec. 8, 2014.

*Primary Examiner* — Jayne Mershon
(74) *Attorney, Agent, or Firm* — Rankin, Hill & Clark LLP

(57) ABSTRACT

A fuel oil provision-vaporization-pressure regulation-full premixed combustion system includes an air pump, a fuel tank, a vaporizing chamber, a preheater, a premix nozzle, an ignition device, a full premixed combustor and an intake guiding device. The air pump communicates with an air inlet of the fuel tank through a first conduit. The fuel tank is provided with a fuel inlet and a fuel outlet pipe. The fuel outlet pipe communicates with a fuel inlet of the vaporizing chamber through a second conduit. The vaporizing chamber is provided with the preheater. A fuel outlet of the vaporizing chamber is in communication with an air inlet of the premix nozzle through a third conduit. An air outlet of the premix nozzle opens to the intake guiding device. An outlet of the intake guiding device communicates with the full premixed combustor. The full premixed combustor is provided with the ignition device.

20 Claims, 4 Drawing Sheets

(51) Int. Cl.
    *F23K 5/22*           (2006.01)
    *F23D 14/02*         (2006.01)
    *H01L 35/30*         (2006.01)

(52) U.S. Cl.
    CPC ... *F23D 2203/105* (2013.01); *F23D 2212/201* (2013.01); *F23K 2301/204* (2013.01); *F23M 2900/13003* (2013.01)

(56) References Cited

FOREIGN PATENT DOCUMENTS

| | | |
|---|---|---|
| CN | 201448842 | 5/2010 |
| CN | 203501169 | 3/2014 |
| CN | 103939895 | 7/2014 |
| FR | 2754332 | 4/1998 |
| JP | S63187009 | 8/1988 |
| JP | 2001153364 | 6/2001 |

\* cited by examiner

FUEL OIL PROVISION-VAPORIZATION-PRESSURE REGULATION-FULL PREMIXED COMBUSTION SYSTEM, THERMOELECTRIC POWER GENERATING DEVICE COMPRISING SUCH SYSTEM AND METHOD

TECHNICAL FIELD

The present invention relates to a combustion system, a power generating device comprising the system and a method, in particular to a fuel oil provision-vaporization-pressure regulation-full premixed combustion system, a thermoelectric power generating device and a method.

BACKGROUND

The electric power we used in daily production and life is mainly from the power supply grid. However, in area far away from the power supply grid, people have to rely on fuel oil generator to obtain constantly stabilized power. While fuel oil such as diesel or gasoline driven, combustion-based generators bring great convenience to the work, study and life to people in areas without power supply.

However, such fuel oil generator has serious shortcomings. An fuel oil generator is a device that converts the energy of fuel into heat, then converts heat into mechanical energy, and finally converts mechanical energy into electric power. Because there is a series of energy conversions in such electricity generation process, devices that implement such mechanism have very complicated structure. A typical fuel internal combustion generator consists of piston, linkage, cam, intake and exhaust valves, variable speed gear, and generator, all of which involve high speed moving parts. Those moving parts will inevitably result in unpleasant noise during the entire generation process of the device. Besides, the complicated structure also results in high failure rate and high maintenance cost.

Fuel oil generator also suffers from another serious shortcoming: in use cases of small output power, its fuel consumption does not decrease in proportion to the decrease of output power. At present, the minimal amount of power output for commercial fuel combustion generators is no less than 300 watts. For such device, minimal fuel consumption rate is about 300 grams per hour, even in idle state where no load is connected. For use cases where load consumption rate is merely tens of watts, such device undoubtedly leads to great amount of waste.

In summary, fuel oil generators have the following shortcomings:

1) high noise level (typically more than 80 dB);
2) complicated structure; high failure rate;
3) high maintenance cost;
4) high fuel consumption rate in the case of small output power.

One of the objects of the present invention is to illustrate a device that can efficiently convert the heat energy released by fuel combustion process directly into electric energy without the involvement of any mechanical moving parts. At present, existing fuel combustors all rely on the process of atmospheric combustion. For example, it is without exception that the combustion of gasoline blast burners and gasoline furnaces is as follows: fuel, upon delivered, combusts with the oxygen from the atmosphere drawn from the outlet. Experiments show that the optimum ratio between the fuel gas and the combustion supporting oxygen is about 1:15. Only at such ratio fuel can be efficiently combusted. During such combustion process, liquid fuel vaporizes at high temperature and expands hundreds of times in volume. As fuel vaporizes and combusts instantly, the atmosphere can not provide sufficient oxygen to support its combustion in a fixed time period. Because such fuel combustion process exposed in atmosphere is generally uncontrollable, it is inevitable that part of the fuel gas will not be fully combusted and will exhaust to the atmosphere as black smoke.

SUMMARY

The first technical problem that the present invention addresses is to provide a fuel oil provision-vaporization-pressure regulation-full premixed combustion system. The premixture of air and vaporized is a key distinction for such combustion system. Specifically fuel, upon vaporized and pressure-regulated, enters a combustor while air enters the combustor at an optimal rate. Consequently, combustion takes place in the combustor. Such mechanism allows for efficient combustion of fuel, without discharging black smoke and harmful exhaust gas.

The second technical problem that the present invention addresses is to provide a fuel oil thermoelectric power generator comprising the fuel oil supply-vaporization-pressure regulation-full premixed combustion system described above. The thermoelectric power generator can convert the heat released by the liquid fuel combustion directly into stable and continuous electric power. Such thermoelectric power generator has a simple structure, with low level of maintenance needs. Because there are no moving parts, the thermoelectric power generator remains quiet during the whole generation process. The range of output power of such thermoelectric power generator is from 10 watts to 150 watts, the fuel consumption rate ranges from 20 to 200 grams per hour. In the case that the user only needs small output power, compared with conventional fuel combustion generator, the present thermoelectric power generator has great economic advantages and performance advantages. The present thermoelectric power generator is suitable to the users working or studying in the field without access to the power grid, with the demand of tens of watts of electric load, such as the electric utilization of communication device or notebook, or the like.

Moreover, the present thermoelectric power generator does not produce any noise during power generation, which can provide a quiet environment to the user and also has great significance in military.

A third technical solution that the present invention addresses is to provide a method of generating power by means of the fuel oil thermoelectric power generator.

In order to solve the first technical problem, the present invention provides a fuel oil supply-vaporization-pressure regulation-full premixed combustion system, comprising an air pump, a fuel tank, a vaporizing chamber, a preheater, a premix nozzle, an intake guiding device, an ignition device and a full premixed combustor;

the air pump is in communication with the fuel tank through a first conduit, the fuel tank is provided with a fuel inlet and a fuel outlet pipe; the fuel outlet pipe is in communication with a fuel inlet of the vaporizing chamber through a second conduit, the vaporizing chamber is provided with a preheater for heating the vaporizing chamber; a fuel outlet of the vaporizing chamber is in communication with an air inlet of the premix nozzle through a third conduit, an air outlet of the premix nozzle is in communication with the full premixed combustor, and the full premixed combustor is provided with the ignition device;

The intake guiding device is disposed between the air outlet of the premix nozzle and the full premixed combustor;

There are air intake ports in the wall of the premix nozzle, the volume ratio of the vaporized gas of fuel oil through the premix nozzle and the sum of the air coming through the air intake ports and the air coming through the intake guiding device is in the range of 1:14 to 1:16.

Preferably, the first conduit is provided with a first one-way valve; the second conduit is in turn provided with an electronic control valve and a second one-way valve; the third conduit is provided with a high temperature pressure regulating valve.

Preferably, the intake guiding device is provided with a flared through hole. When the vaporized gas of fuel oil enters the full premixed combustor at a high speed, air will be carried into the full premixed combustor from the area between the premix nozzle and the flared through hole.

More preferably, the flared through hole of the air guiding device 80 has an inner diameter of 22-25 cm at one end, and an inner diameter of 12-16 cm at the other end.

Preferably, the premix nozzle is a hollow conduit and comprises a left end cavity, a right end cavity, a tapering hole; wherein the left end cavity is the air inlet of the premix nozzle, the right end cavity is the air outlet of the premix nozzle; the left end cavity is in communication with the right end cavity through the tapering hole; the wall of the right end cavity has 4-6 air intake ports uniformly distributed.

Preferably, the diameter of the said left end cavity is between 4 and 6 mm; the diameter of the right end cavity is between 6 and 8 mm; the diameter of the said tapering hole is between 0.1 and 0.5 mm; and the diameter of the air intake port is between 3 and 6 mm.

Preferably, the full premixing combustor comprises a combustor body and two combustion cavities at two sides of the combustor body; the combustor body is in the middle and sandwiched by two perforated metal plates; there are high-temperature-resistant metal fiber fabrics at the outside of the perforated metal plates; the combustion cavity is between the perforated metal plate and the metal fiber fabrics.

The actual measurement value of the pressure of the vaporizing chamber is about 0.1 MPa, according to Bernoulli equation:

1. The flow speed of the fuel gas at the vaporizing chamber outlet:

$$V_1 = \sqrt{\frac{2gP_1}{\gamma}} = \sqrt{\frac{2*9.8*1}{0.75}} = 5.1 \text{ M/s}$$

2. The flow speed of the fuel gas at the tapering hole of the premix nozzle:

$$V_2 = \frac{\pi}{4}\left(\frac{d_1}{d_2}\right)^2 * V_1 = \frac{3.14}{4}*\left(\frac{1.5}{0.3}\right)^2 * 5.1 = 100 \text{ M/s}$$

3. The flow speed of the fuel gas at the air outlet of the premix nozzle:

$$V_3 = \left(\frac{d_2}{d_3}\right)^2 * V_2 = \left(\frac{0.3}{6}\right)^2 * 100 = 0.25 \text{ M/s}$$

4. the pressure at the air inlet of the premix nozzle:

$$P_2 = \frac{V_3^2 * \gamma}{2g} = \frac{0.25^2 * 0.75}{2*9.8} = 2.4*10^{-3} \text{ kg/cm}^2$$

5. the flow speed of air at the air inlet of the premix nozzle:

$$V_4 = \sqrt{\frac{2gP_2}{\gamma}} = \sqrt{\frac{2*9.8*2.4*10^{-3}}{0.75}} = 0.25 \text{ M/s}$$

6. the flow speed of air at the intake guiding device:

$$V_5 = \sqrt{\frac{2gP_2}{\gamma}} = \sqrt{\frac{2*9.8*2.4*10^{-3}}{0.75}} = 0.25 \text{ M/s}$$

Calculated Flow:

1. Fuel gas flow:

$$Q_1 = \frac{\pi}{4}d_2^2 * V_2 = \frac{3.14}{4}*0.3^2*100 = 7 \text{ ml/s}$$

2. The flow of the air intake at the premix nozzle:

$$Q_2 = \frac{\pi}{4}d_3^2 * V_4 = \frac{3.14}{4}*4^2*0.25 = 3.14 \text{ ml/s}$$

3. The flow at the air intake of the intake guiding device:

$$Q_3 = \frac{\pi}{4}(d_5^2 - d_4^2) * V_5 = \frac{3.14}{4}*(22^2 - 8^2)*0.25 = 82.4 \text{ ml/s}$$

4. Total air intake amount:

$6Q_2 + Q_3 = 6*3.14 + 82.4 = 101.2$ ml/s

5. The ratio of the total air amount to the fuel gas amount:

$$i = \frac{6Q_2 + Q_3}{Q_1} = \frac{101.2}{7} = 14.5$$

It can be seen from the calculation that, when only using the above mentioned preferred premix nozzle, the air intake amount is far from enough, and cannot meet the design requirement of the device; however, by the use of the intake guiding device, the air entering the combustor can be greatly increased and can satisfy the supporting air ratio required by sufficient combustion of the fuel.

The fuel oil provision-vaporization-pressure regulation-full premixed combustion system of the present invention uses fuel oil as heat source. Because fuel oil (such as gasoline, diesel etc.) is a mixture of multiple hydrocarbons, each of the hydrocarbons has different physical and chemical property. Therefore, unlike fuel gas, the property of the fuel oil appears to be uncontrollable. Fuel gas is mainly made up by a single substance, for example, the main constituent of the artificial coal gas is carbonic oxide, and the main constituent of the liquefied petroleum gas is methane. Under normal temperature, the fuel gas is in gaseous state, and the molecules are isolated to each other. Therefore, the energy required by ignition is very small. It can be ignited by only tiny spark produced by the high voltage discharge of the coal gas igniter. Because of this, the property of the fuel gas appears to be easily controlled. However, fuel oil is a kind of portable energy source with high heat value. In daily work and life, it is hard to use the heat energy released by the combustion of the fuel oil efficiently, safely and conveniently, due to the poor controllability of the fuel oil. Until now, in prior art, because of the odd property of the fuel oil, the vaporization and the combustion of the fuel oil occur instantly almost at the same time. The control of the combustion of the fuel oil is very troublesome. The fuel oil is in liquid state under normal temperature. With the rising of the temperature, gas continuously escapes from the surface of the liquid, such escaping gas is called volatile gas. Even such volatile gas is in the form of multiple hydrocarbons. Its combustion requires a lot of energy. The tiny spark produced by coal gas igniter cannot ignite it, and it needs high temperature caused by open flame or electric arc to vaporize it into isolated molecules of different substances so as to combust.

The fuel oil (including gasoline and diesel) is in liquid state under normal temperature, hence the mixture of multiple hydrocarbons cannot be ignited. The vaporization temperature of the fuel oil is 130° C.-270° C. When the temperature of the fuel oil reaches the temperature range, the multiple hydrocarbons are separated into combustible molecular gas; when the temperature is lower than 130° C., it restores to the mixture with multiple hydrocarbons difficult to burn. Therefore, by means of the above mentioned device of the present invention, the vaporization and the combustion of the fuel oil can be separated, instead of occurring at instant. The device of the present invention does not only solve the problem of insufficient combustion of the fuel oil, but also achieve the purpose of controllable combustion of the vaporized fuel oil and air mixed at a ratio.

In order to solve the above mentioned second technical problem, the present invention provides a fuel oil thermoelectric power generating device comprising the above described fuel oil provision-vaporization-pressure regulation-full premixed combustion system, the fuel oil thermoelectric power generating device comprising a fuel oil provision-vaporization-pressure regulation-full premixed combustion system and a power generating device; the power generating device comprises a combustion chamber, a thermoelectric power generation module and a heat pipe radiator; the heat pipe radiator comprises an evaporator, a heat pipe and a cooler; the thermoelectric power generation module is disposed between the combustion chamber and the evaporator, the evaporator is in communication with the cooler through the heat pipe; the thermoelectric power generation module is connected with a load through a conductor; the full premixed combustor of the fuel oil provision-vaporization-pressure regulation-full premixed combustion system is disposed in the combustion chamber.

Preferably, the fuel oil thermoelectric power generator further comprises a microcontroller; the fuel tank of the fuel oil provision-vaporization-pressure regulation-full premixed combustion system is provided with a first pressure sensor and a liquid level sensor; the vaporizing chamber of the fuel oil provision-vaporization-pressure regulation-full premixed combustion system is provided with a first temperature sensor and a second pressure sensor; the side of the thermoelectric power generation module that is connected with the combustion chamber is the hot side, and the side of the thermoelectric power generation module that is connected with the evaporator is the cool side, the hot side is provided with a second temperature sensor, the cool side is provided with a third temperature sensor; the microcontroller is in communication with the first pressure sensor, the second pressure sensor, the liquid level sensor, the first temperature sensor, the second temperature sensor, the third temperature sensor, the air pump, the electronic control valve, the preheater and the ignition device through data transmission lines, respectively. The electric load driven by the fuel oil thermoelectric power generating device of the present invention determines the temperature difference of the thermoelectric power generation module. The bigger the load, the greater the temperature difference required by the module; and vice versa. Therefore, each of the two sides of the electric generating module is provided with a temperature sensor. The electronic control valve is opened according to the load driven by the device to control the input amount of fuel oil, so as to adjust the temperature of the combustion chamber; the vaporizing chamber is provided with a pressure sensor and a temperature sensor to control the input amount of fuel oil and the activation and deactivation of the preheater. Besides, the fuel tank is provided with a liquid level sensor to indicate the amount of the fuel oil. The opening, closing and opening period depend on the temperature and pressure inside the vaporizing chamber. To this end, the vaporizing chamber is provided with a pressure sensor and a temperature sensor so as to control the electronic control valve.

Preferably, the conductor connecting the thermoelectric power generation module and the load is provided with a power supply voltage stabilizing device; a conductor between the power supply voltage stabilizing device and the load is connected with a battery.

Preferably, the battery is connected with the air pump, the electronic control valve, the ignition device, the preheater and the microcontroller through a conductor. That is to say, the battery is used to supply power to the air pump, the electronic control valve, the ignition device, the preheater, and the microcontroller when the entire device is started. Once the device is in normal operation and the semiconductor thermoelectric power generation module generates power, it can continuously to supply stable voltage to the above mentioned load, and also float-charges the battery.

Preferably, the hot side of the combustion chamber is a concave-convex structure. In this way, the area of the hot side can be greatly increased. The material of the combustion chamber is metal material with high heat transfer coefficient (such as red copper, brass, aluminum, or aluminum alloy and the like).

Preferably, the vaporizing chamber, the high temperature pressure regulating valve and the combustion chamber are tightly contacted. The high temperature pressure regulating valve must remain at a temperature higher than the vaporization temperature all the time. If the high temperature pressure regulating valve is at a temperature lower than the vaporization temperature, when the vaporized fuel oil passes through the pressure regulating valve, the vaporized fuel oil will condense and revert to a mixture of multiple noncombustible hydrocarbons, and form droplets running down. Because the vaporizing chamber, the combustion chamber and the high temperature pressure regulating valve are designed to be tightly contacted, when the combustor is in operation, the combustor will transfer part of its heat to the vaporizing chamber and the pressure regulating valve. Once the vaporizing chamber and the pressure regulating valve reach the vaporization temperature of the fuel oil, the preheater will stop operating, and the vaporization-pressure regulating device can be ensured to operate normally.

In order to solve the above mentioned third technical problem, the present invention provides a power generating method by means of the fuel oil thermoelectric power generating device above, it comprises the following steps:
1) the microcontroller issues instructions that the preheater preheats the vaporizing chamber and the high temperature pressure regulating valve;
2) the air pump is activated to keep the fuel tank at the pressure of between 0.06 and 0.10 MPa when the temperatures of the vaporizing chamber and the high temperature pressure regulating valve reach between 130 and 270° C.;
3) the electronic control valve on the second conduit is turned on, so that the internal pressure of the fuel tank forces the fuel oil to enter the vaporizing chamber by an amount of between 0.35 and 0.4 ml each time. Because the temperature of the vaporizing chamber reaches up to 130-270° C., the fuel oil can be vaporized instantly. During instant vaporization of the fuel oil, its volume will expand hundreds of times so that the pressure in the vaporizing chamber will be increased sharply;
4) the high pressured vaporized gas in the vaporizing chamber passes through the high temperature pressure regulating valve, so that the high pressured vaporized gas becomes vaporized gas of fuel oil at constant pressure of between 0.08 and 0.12 MPa and enters the premix nozzle. Because the inside bore of the premix nozzle is a tapering hole, the speed of the vaporized gas of fuel oil will increase greatly; the premix nozzle is provided with 4-6 air intake ports that are in communication with the atmosphere; when the vaporized gas of fuel oil passes through the premix nozzle at high speed, the resulting negative pressure will force air to enter the full premixed combustor through the intake guiding device together with the vaporized gas; at the same time, the intake guiding device also drives a lot of air into the full premixed combustor. The volume ratio of the vaporized gas of fuel oil through the premix nozzle and the sum of the air coming through the air intake port and the air coming through the intake guiding device is between 1:14 and 1:16;
5) the ignition device ignites mixed gas of the vaporized gas of fuel oil and the air by and the mixed gas burns sufficiently in the combustion chamber after the vaporized gas of fuel oil entering the full premixed combustor at high speed together with the air. Preferably, the full premixed combustor is divided into three sections, that is, a combustor body and two combustion cavities at two sides of the combustor body; the combustor is in the middle and sandwiched by two perforated metal plates; there are high-temperature-resistant metal fiber fabrics at the outside of the perforated metal plates; the combustion cavity is between the perforated metal plate and the metal fiber fabrics. When the mixed gas of the vaporized gas and the air is combusted in the combustor, the flame caused by the combustion is limited in the area between the perforated metal plate and the metal fiber, that is, within the combustion cavity. Looking from the outside, during combustion, the combustor looks similar to a red hot iron block. The heating of the combustor can be directed and thus can provide heat in any specified direction. If the combustion flame expands beyond the high-temperature-resistant metal fiber fabric, then the flame will be forced upwards, most heat will discharge with exhaust gas through the exhaust port, greatly reducing the recirculation rate of heat into the combustor. Therefore, the efficiency of combustion for the present invention achieves an optimal level.
6) The hot side of the thermoelectric power generation module is in tight contact with the heating surface of the combustion chamber so that the heat generated from combustion chamber can transfer to the thermoelectric power generation module quickly; the cool side of the thermoelectric module is in tight contact with the evaporator so that the heat received by the thermoelectric module can be transferred to the evaporator quickly; thereafter, the heat will be carried away by the heat pipe and the cooler. When the thermoelectric module absorbs heat and the heat pipe dissipates heat, the thermoelectric module can continuously output electric energy to the outside.

The present invention provides the following benefits:

Semiconductor thermoelectric power generation is a new way of generating electricity, which can convert heat directly into electric energy, whose process is described as Seebeck effects. The semiconductor thermoelectric power generator made by semiconductor thermoelectric power generation module can generate electricity as long as there is temperature difference between its two sides. Such generation process has the following advantages: it produces no noise in operation, no pollution, has simple structure, requires extremely low level of maintenance, and has a long usage life of more than 10 years. Therefore, the present invention is a portable electricity power source that has wide application.

Generally speaking, in wild field without access to the electric grid, when people want to use electric appliance for an extended period of time, without exception, they always adopt liquid oil engine to drive the generator in order to obtain electric power. Even when the engine power is at its minimum, its fuel oil consumption is no less than 300 grams per hour, which is economic for electric load with a power of more than 300 watts, but if the required electric load is only several watts to tens of watts, using such power generator would undoubtedly be a great waste. According to the experimental result of the present device, if the output power of the semiconductor thermoelectric power generation is 50 watts, its oil consumption is lower than 70 grams per hour. Therefore, if the electric load has a power of less than 300 watts, the use of the present invention can bring significant economic benefit.

The present invention not only can provide efficient combustion of liquid fuel without exhausting harmful gas, it can also provide control the rate and intensity of the combustion of liquid fuel.

Moreover, the device of the present invention can provide characteristic advantages that cannot be achieved by conventional fuel combustion generators, such as simple structure, extremely small amount of maintenance, long usage life, and no noise in normal operation.

BRIEF DESCRIPTION OF THE DRAWINGS

The embodiments of the present invention will be described in more detail with reference to the drawings.

DETAILED DESCRIPTION

First Embodiment

Figure 1:
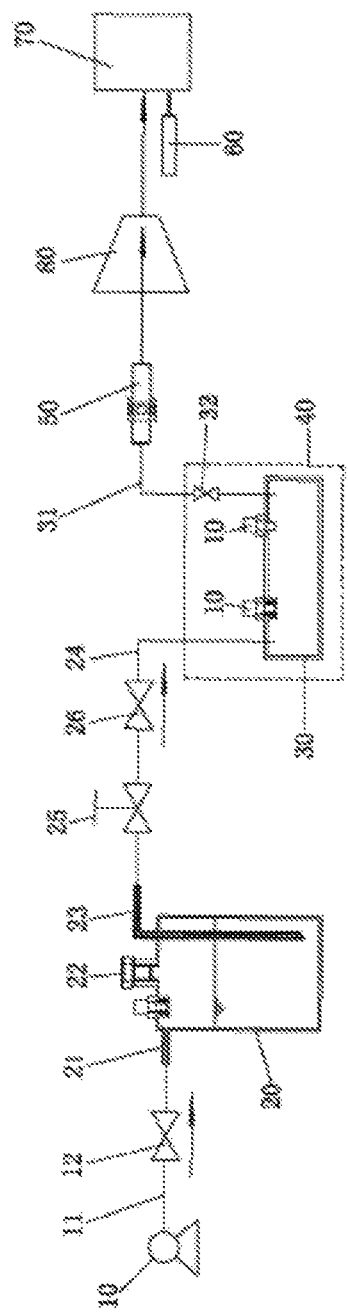
FIG. 1 is a schematic view of a fuel oil provision-vaporization-pressure regulation-full premixed combustion system according to a first embodiment of the present invention.
Figure 2:
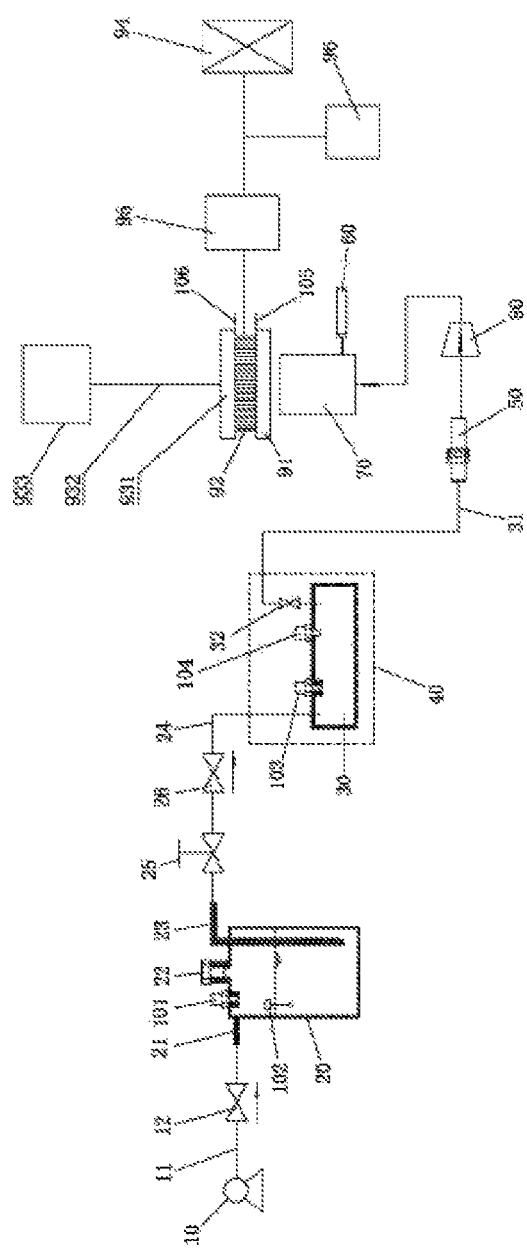
FIG. 2 is a schematic view of a fuel oil thermoelectric power generating device according to a second embodiment of the present invention.

As shown in FIG. 1 and FIG. 2, the present invention provides a fuel oil provision-vaporization-pressure regulation-full premixed combustion system, comprising an air pump 10, a fuel tank 20, a vaporizing chamber 30, a preheater 40, a premix nozzle 50, an ignition device 60, a full premixed combustor 70 and an intake guiding device 80. The air pump 10 is in communication with the air inlet 21 of the fuel tank 20 through a first conduit 11, the fuel tank 20 is provided with a fuel inlet 22 and a fuel outlet pipe 23; the fuel outlet pipe 23 is in communication with the fuel inlet of the vaporizing chamber 30 through a second conduit 24; the vaporizing chamber 30 is provided with a preheater 40 for heating the vaporizing chamber 30; the fuel outlet of the vaporizing chamber 30 is in communication with the air inlet of the premix nozzle 50 through a third conduit 31; the air outlet of the premix nozzle 50 opens to the intake guiding device 80; the air outlet of the intake guiding device 80 is in communication with the full premixed combustor 70, and the full premixed combustor 70 is provided with an ignition device 60.

Figure 5:
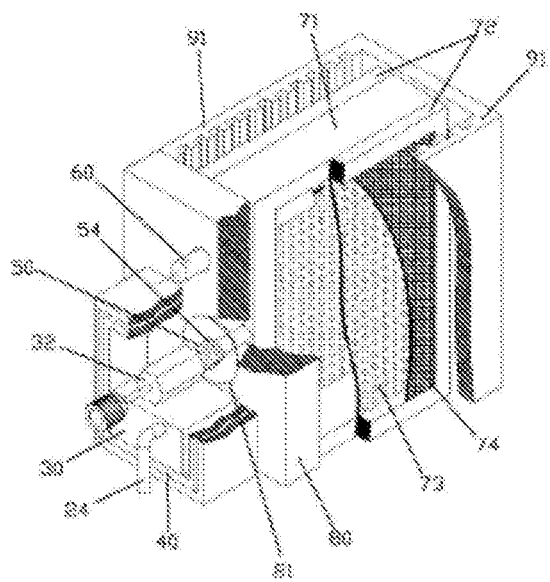
FIG. 5 is a schematic view of the structure of the fuel oil vaporization-pressure regulation-full premixed combustion device according to present invention.

As shown in FIG. 5, the center of the intake guiding device 80 is provided with a flared through hole 81. When the vaporized gas of fuel oil enters the full premixed combustor at high speed, air will be carried into the full premixed combustor 70 from the area between the air intake port 54 of the premix nozzle 50 and the flared through hole 81. The flared through hole 80 of the air guiding device 80 has an inner diameter of 22 cm at one end, and an inner diameter of 12 cm at the other end.

Figure 4:
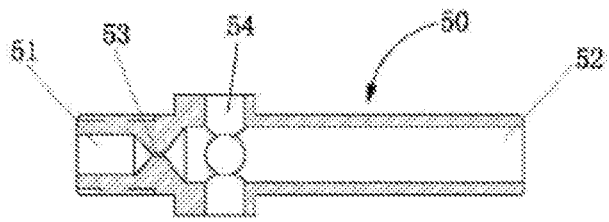
FIG. 4 is a schematic view of the structure of the premix nozzle according to the present invention.

As shown in FIG. 4, the premix nozzle 50 is a hollow conduit, the premix nozzle 50 comprises a left end cavity 51, a right end cavity 52 and a tapering hole 53; wherein the left end cavity 51 is an air inlet, the right end cavity 52 is an air outlet; the left end cavity 51 is in communication with the right end cavity 52 through the tapering hole 53; the wall of the right end cavity has 6 air intake ports 54 uniformly distributed. The diameter of the left end cavity 51 is about 5 mm; the diameter of the right end cavity 52 is about 6 mm; the diameter of the tapering hole 53 is about 0.3 mm; and the diameter of the air intake ports 54 is about 4 mm;

The volume ratio of the vaporized gas of fuel oil through the premix nozzle 50 and the sum of the air coming through the air intake port 54 and the air coming through the intake guiding device 80 is about 1:14.5.

The first conduit 11 is provided with a first one-way valve 12; the second conduit 24 is in turn provided with an electronic control valve 25 and a second one-way valve 26; the third conduit 31 is provided with a high temperature pressure regulating valve 32.

As shown in FIG. 5, the full premixed combustor 70 comprises a combustor body 71 and two combustion cavities 72 at two sides of the combustor body 71. The combustor body 71 is in the middle and sandwiched by two perforated metal plates 73; there are high-temperature-resistant metal fiber fabrics 74 at the outside of the perforated metal plates 73; the combustion chamber is between the perforated metal plates 73 and the metal fiber fabrics 74.

Second Embodiment

Repeating embodiment 1, the difference from the first embodiment lies in that the flared through hole 81 of the air guiding device 80 has an inner diameter of 25 cm at one end, and an inner diameter of 16 cm at the other end; the diameter of the left end cavity 51 is 6 mm; the diameter of the right end cavity 52 is 8 mm; the diameter of the tapering hole 53 is 0.5 mm; and the diameter of the air intake port 54 is 6 mm.

Third Embodiment

Repeating embodiment 1, the difference lies in that the flared through hole 81 of the air guiding device 80 has an inner diameter of 23 cm at one end, and an inner diameter of 14 cm at the other end; the diameter of the left end cavity 51 is 4 mm; the diameter of the right end cavity 52 is 6 mm; the diameter of the tapering hole 53 is 0.1 mm; and the diameter of the air intake port 54 is 3 mm.

Fourth Embodiment

Figure 6:
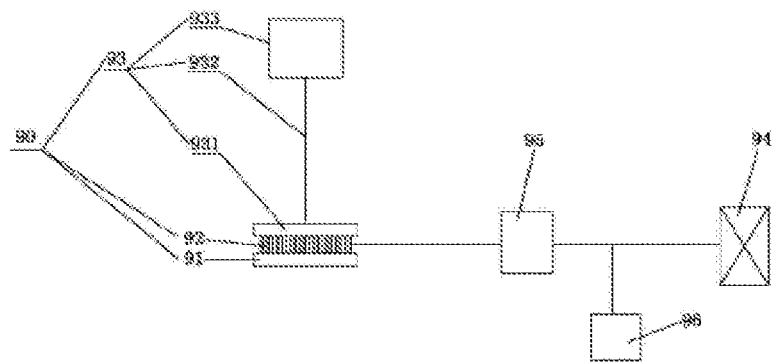
FIG. 6 is a schematic view of the structure of the power generating device.

As shown in FIG. 2 and FIG. 6, the present invention provides a system comprising the fuel oil thermoelectric power generating device according to any one of first to third embodiments. The system includes a fuel oil provision-vaporization-pressure regulation-full premixed combustion system and a power generating device 90. The power generating device 90 comprises a combustion chamber 91, a thermoelectric power generation module 92 and a heat pipe radiator 93. The heat pipe radiator 93 comprises an evaporator 931, a heat pipe 932 and a cooler 933. The thermoelectric power generation module 92 is disposed between the combustion chamber 91 and the evaporator 931; the evaporator 931 is in communication with the cooler 933 through a heat pipe 932. The thermoelectric power generation module 92 is connected with a load 94 through a conductor. The combustion chamber is provided with a full premixed combustor of the fuel oil provision-vaporization-pressure regulation-full premixed combustion system.

The conductor connecting the thermoelectric power generation module 92 and the load 94 is provided with a power supply voltage stabilizing device 95. The conductor between the power supply voltage stabilizing device 95 and the load 94 is connected with a battery 96. The battery can supply power to the air pump 10, the electronic control valve 25, the ignition device 60, the preheater 40 and a control circuit when the entire power generating device is started. Once the device is in normal operation and the semiconductor thermoelectric power generation module generates power, it can continuously supply stable voltage to the above mentioned load, and also float-charges the battery.

Figure 3:
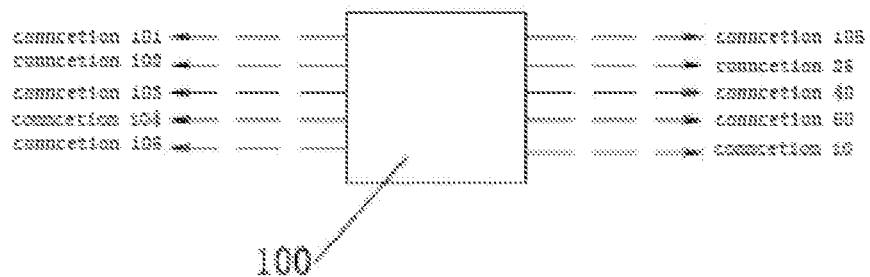
FIG. 3 is a connection schematic of the microcontroller of the present invention.

As shown in FIG. 3, the fuel oil thermoelectric power generator further comprises a microcontroller unit 100; the fuel tank 20 of the fuel oil provision-vaporization-pressure regulation-full premixed combustion system is provided with a first pressure sensor 101 and a liquid level sensor 102; the vaporizing chamber 30 of the fuel oil provision-vaporization-pressure regulation-full premixed combustion system is provided with a first temperature sensor 103 and a second pressure sensor 104; the side of the thermoelectric power generation module 92 that is connected with the combustion chamber 91 is the hot side, and the side of the thermoelectric power generation module 92 that is connected with the evaporator is the cool side, the hot side is provided with a second temperature sensor 105, the cool side is provided with a third temperature sensor 106; the microcontroller is in communication with the first pressure sensor 101, the second pressure sensor 104, the liquid level sensor 102, the first temperature sensor 103, the second temperature sensor 105, the third temperature sensor 106, the air pump 10, the electronic control valve 25, the preheater 40 and the ignition device 60 through data transmission lines respectively. The electric load driven by the fuel oil thermoelectric power generating device of the present invention determines the temperature difference of the thermoelectric power generation module. The bigger the load, the greater the temperature difference is required by the module, and vice versa. Therefore, each of the two faces of the electric generating module 92 is provided with a temperature sensor. The opening period and the interval of the electronic control valve depend on the load driven by the device, so as to adjust the temperature of the combustion chamber 91; the vaporizing chamber 30 is provided with the second pressure sensor 104 and the first temperature sensor 103 to control the input amount of the fuel oil and the activation and deactivation of the preheater. Besides, the fuel tank 20 is also provided with a first pressure sensor 101 and a liquid level sensor 102 to control the internal pressure of the fuel tank and indicate the amount of the fuel oil. The opening, closing and opening period of the electronic control valve 25 depend on the temperature and pressure inside the vaporizing chamber 30. To this end, the vaporizing chamber 30 is provided with the second pressure sensor and the first temperature sensor so as to control the electronic control valve 25.

Fifth Embodiment

As shown in FIG. 5, repeating the fourth embodiment, the further improvement lies in that: the vaporizing chamber 30, the high temperature pressure regulating valve 32 and the combustion chamber 91 are tightly contacted through the intake guiding device 80. The high temperature pressure regulating valve must remain at a temperature higher than the vaporization temperature all the time. If the high temperature pressure regulating valve is at a temperature lower than the vaporization temperature, when the vaporized gas of fuel oil passes through the pressure regulating valve, the vaporized gas of fuel oil will condense and revert to a state of a mixture of multiple hydrocarbons that is hard to burn, and form droplets running down. Because the vaporizing chamber, the high temperature pressure regulating valve and the combustion chamber are designed to be tightly contacted, when the combustor is in operation, the combustor will transfer part of its heat to the vaporizing chamber and the pressure regulating valve. Once the vaporizing chamber and the pressure regulating valve reach the vaporization temperature of the fuel oil, the preheater will stop operating, and the vaporization-pressure regulating device can be ensured to operate normally.

The heated face of the combustion chamber 91 may be a concave-convex structure. In this way, the area of the heated face can be greatly improved. The material of the combustion chamber may be metal material with high heat transfer coefficient (such as red copper material).

Sixth Embodiment

The present invention provides a power generating method by means of the fuel oil thermoelectric power generating device, it comprises the following steps:

1) The microcontroller 100 issues instruction that the preheater 40 preheats the vaporizing chamber 30 and the high temperature pressure regulating valve 32;
2) When the temperatures of the vaporizing chamber 30 and the high temperature pressure regulating valve 32 reach 130-270° C., the air pump 10 is activated to keep the fuel tank 20 at the pressure of 0.1 MPa;
3) the electronic control valve 25 on the second conduit is turned on, the pressure of the fuel tank 20 forcing the fuel oil to enter the vaporizing chamber 30 by an amount of 0.35-0.4 ml each time. Because the temperature of the vaporizing chamber reaches up to 130-270° C., the fuel oil can be vaporized instantly. During instant vaporization of the fuel oil, its volume will expand hundreds of times so that the pressure in the vaporizing chamber 30 will be increased sharply to 0.1-0.15 MPa;
4) The high pressured vaporized gas of fuel oil in the vaporizing chamber 30 becomes vaporized gas of fuel oil at constant pressure of 0.01 MPa through the high temperature pressure regulating valve 32, and enters the premix nozzle 50. Because the inside bore of the premix nozzle 50 is a tapering hole 53, the speed of the vaporized gas of fuel oil passing through the tapering hole 53 will increase greatly. The premix nozzle 50 is provided with 6 air intake ports that are in communication with the atmosphere; when the vaporized gas of fuel oil passes through the premix nozzle 50 at high speed, the resulting negative pressure will force air coming through the air intake ports communicating with the atmosphere to enter the full premixed combustor 70 through the intake guiding device 80 together with the vaporized gas;
5) After the vaporized gas of fuel oil at high speed entering the full premixed combustor 70 together with the air, the ignition device 60 igniting the mixed gas and the mixed gas burning sufficiently in the combustion chamber 91. Preferably, the full premixed combustor is divided into three sections, that is, a combustor body 71 and two combustion cavities 72 at two sides of the combustor body 71. The combustor body 71 is in the middle and sandwiched by two perforated metal plate 73. There are high-temperature-resistant metal fiber fabrics 74 at the outside of the perforated metal plates 73. The combustion cavity is between the perforated metal plate 73 and the metal fiber fabrics 74.
6) The hot side of the thermoelectric power generation module 92 is tightly contacted with the heating face of the combustion chamber 91 so that the heat from the combustion chamber 91 can transfer to the thermoelectric power generation module 92 quickly; the cool side of the thermoelectric power generation module 92 is tightly contacted with the evaporator 931 so that the heat received by the thermoelectric power generation module 92 can be transferred to the evaporator 931 quickly; thereafter, the heat will be carried away by the heat pipe 932 and cooler 933. When the thermoelectric power generation module 92 absorbs heat and the heat pipe 932 dissipates heat, temperature difference forms between the two sides of the thermoelectric power generation module, so the thermoelectric power generation module 92 can continuously output electric energy to the outside.

Through examination, the fuel oil can combust thoroughly in the full premixed combustor 70. There is no black smoke and no harmful gas in the exhaust gas and the combustion speed is controllable. The present invention achieves ideal beneficial effects.

The terms describing orientations such as "upper", "lower", "left" or "right" are only for the convenience of illustrating based on the orientation shown in the drawings. In practical applications, such orientations can be different depending on the placement of the device.

Obviously, the above embodiments of the present invention are only examples for illustrating the principle of the present invention. As to those skilled in the art, they can make any other variations or modifications in forms and details based on the above illustration. All those modified or varied embodiments cannot be exhaustively described herein. However, all those obvious modifications and variations base on the technical solutions of the present invention are within the protection scope of the present invention.

What is claimed is:

1. A fuel oil provision-vaporization-pressure regulation-full premixed combustion system, comprising an air pump, a fuel tank, a vaporizing chamber, a preheater, a premix nozzle, an intake guiding device, an ignition device and a full premixed combustor;
    wherein the air pump is in communication with the fuel tank through a first conduit, the fuel tank is provided with a fuel inlet and a fuel outlet pipe; the fuel outlet pipe is in communication with a fuel inlet of the vaporizing chamber through a second conduit; the vaporizing chamber is provided with the preheater for heating the vaporizing chamber; a fuel outlet of the vaporizing chamber is in communication with an air inlet of the premix nozzle through a third conduit, an air outlet of the premix nozzle is in communication with the full premixed combustor, and the full premixed combustor is provided with the ignition device;
    the intake guiding device is disposed between the air outlet of the premix nozzle and the full premixed combustor;
    air intake ports are disposed in the wall of the premix nozzle, the volume ratio of the vaporized fuel oil through the premix nozzle and the sum of the air coming through the air intake ports and the air coming through the intake guiding device is in the range of 1:14 to 1:16.

2. The fuel oil provision-vaporization-pressure regulation-full premixed combustion system according to claim 1, wherein the intake guiding device is provided with a flared through hole.

3. The fuel oil provision-vaporization-pressure regulation-full premixed combustion system according to claim 2, wherein the flared through hole of the air guiding device has an inner diameter of between 22 and 25 cm at one end, and an inner diameter of between 12 and 16 cm at the other end.

4. The fuel oil provision-vaporization-pressure regulation-full premixed combustion system according to claim 2, wherein the premix nozzle is a hollow conduit and comprises a left end cavity, a right end cavity and a tapering hole; wherein the left end cavity is the air inlet of the premix nozzle, the right end cavity is the air outlet of the premix nozzle; the left end cavity is in communication with the right end cavity through the tapering hole; the air intake ports are uniformly distributed on the wall of the right end cavity and the number of the air intake ports is in range of 4 to 6.

5. The fuel oil provision-vaporization-pressure regulation-full premixed combustion system according to claim 4, wherein the diameter of the left end cavity is between 4 and 6 mm; the diameter of the right end cavity is between 6 and 8 mm; the diameter of the tapering hole is between 0.1 and 0.5 mm; and the diameter of the air intake port is between 3 and 6 mm.

6. The fuel oil provision-vaporization-pressure regulation-full premixed combustion system according to claim 1, wherein the full premixed combustor comprises a combustor body and two combustion cavities at two sides of the combustor body; the combustor body is in the middle and sandwiched by two perforated metal plates; high-temperature-resistant metal fiber fabrics are disposed at the outside of the perforated metal plates; the combustion cavity is between the perforated metal plate and the metal fiber fabrics.

7. The fuel oil provision-vaporization-pressure regulation-full premixed combustion system according to claim 1, wherein the first conduit is provided with a first one-way valve; the second conduit is in turn provided with an electronic control valve and a second one-way valve; the third conduit is provided with a high temperature pressure regulating valve.

8. A fuel oil thermoelectric power generating device comprising the fuel oil provision-vaporization-pressure regulation-full premixed combustion system according to claim 1, further comprising a power generating device;
    wherein the power generating device comprises a combustion chamber, a thermoelectric power generation module and a heat pipe radiator; the heat pipe radiator comprises an evaporator, a heat pipe and a cooler; the thermoelectric power generation module is disposed between the combustion chamber and the evaporator, the evaporator is in communication with the cooler through the heat pipe; the thermoelectric power generation module is connected with a load through a conductor; the full premixed combustor of the fuel oil provision-vaporization-pressure regulation-full premixed combustion system is disposed in the combustion chamber.

9. The fuel oil thermoelectric power generating device according to claim 8, wherein the fuel oil thermoelectric power generating device further comprises a microcontroller; the fuel tank of the fuel oil provision-vaporization-pressure regulation-full premixed combustion system is provided with a first pressure sensor and a liquid level sensor, the vaporizing chamber of the fuel oil provision-vaporization-pressure regulation-full premixed combustion system is provided with a first temperature sensor and a second pressure sensor; the side of the thermoelectric power generation module that is connected with the combustion chamber is the hot side, and the side of the thermoelectric power generation module that is connected with the evaporator is the cool side, the hot side is provided with a second temperature sensor, the cool side is provided with a third temperature sensor; the microcontroller is in connection with the first pressure sensor, the second pressure sensor, the liquid level sensor, the first temperature sensor, the second temperature sensor, the third temperature sensor, the air pump, the electronic control valve, the preheater and the ignition device through data transmission lines, respectively.

10. The fuel oil thermoelectric power generating device according to claim 8, wherein the conductor connecting the thermoelectric power generation module and the load is provided with a power supply voltage stabilizing device; the conductor connecting between the power supply voltage stabilizing device and the load is connected with a battery.

11. The fuel oil thermoelectric power generating device according to claim 10, wherein the battery is in connection with the air pump, the electronic control valve, the ignition device, the preheater and the microcontroller through a conductor.

12. The fuel oil thermoelectric power generating device according to claim 8, wherein the hot side of the combustion chamber is a concave-convex structure.

13. The fuel oil thermoelectric power generating device according to claim 12, wherein the material of the combustion chamber is metal material with high heat transfer coefficient, preferably red copper, brass, aluminum or aluminum alloy.

14. The fuel oil thermoelectric power generating device according to claim 8, wherein the vaporizing chamber, the high temperature pressure regulating valve and the combustion chamber are structures that are tightly contacted.

15. A method for generating power by means of the fuel oil thermoelectric power generating device according to claim 8, comprising:
1) issuing, by the microcontroller, instructions that the preheater preheats the vaporizing chamber and the high temperature pressure regulating valve;
2) activating the air pump to keep the fuel tank at the pressure of between 0.06 and 0.10 MPa when the temperatures of the vaporizing chamber and the high temperature pressure regulating valve reach between 130 and 270 ° C.;
3) turning on the electronic control valve on the second conduit, so that the internal pressure of the fuel tank forces the fuel oil to enter the vaporizing chamber by an amount of between 0.35 and 0.4 ml each time and the fuel oil becomes high pressured vaporized gas;
4) passing the high pressured vaporized gas in the vaporizing chamber through the high temperature pressure regulating valve, so that the high pressured vaporized gas becomes vaporized gas of fuel oil at constant pressure of between 0.08 and 0.12 MPa and enters the premix nozzle;
passing the air through the air intake ports of the premix nozzle into the full premixed combustor together with the vaporized gas of fuel oil through the intake guiding device;
wherein the volume ratio of the vaporized gas of fuel oil through the premix nozzle and the sum of the air coming through the air intake ports and the air coming through the intake guiding device is 1:14-1:16;
5) igniting mixed gas of the vaporized gas of fuel oil and the air by the ignition device and causing the mixed gas to burn sufficiently in the combustion chamber after the vaporized gas of fuel oil entering the full premixed combustor at high speed together with the air;
6) outputting, by the thermoelectric power generation module, electric energy continuously.

16. A fuel oil thermoelectric power generating device comprising the fuel oil provision-vaporization-pressure regulation-full premixed combustion system according to claim 4, further comprising a power generating device;
wherein the power generating device comprises a combustion chamber, a thermoelectric power generation module and a heat pipe radiator;
the heat pipe radiator comprises an evaporator, a heat pipe and a cooler;
the thermoelectric power generation module is disposed between the combustion chamber and the evaporator, the evaporator is in communication with the cooler through the heat pipe;
the thermoelectric power generation module is connected with a load through a conductor; the full premixed combustor of the fuel oil provision-vaporization-pressure regulation-full premixed combustion system is disposed in the combustion chamber.

17. A fuel oil thermoelectric power generating device comprising the fuel oil provision-vaporization-pressure regulation-full premixed combustion system according to claim 6, further comprising a power generating device;
wherein the power generating device comprises a combustion chamber, a thermoelectric power generation module and a heat pipe radiator; the heat pipe radiator comprises an evaporator, a heat pipe and a cooler;
the thermoelectric power generation module is disposed between the combustion chamber and the evaporator, the evaporator is in communication with the cooler through the heat pipe;
the thermoelectric power generation module is connected with a load through a conductor; the full premixed combustor of the fuel oil provision-vaporization-pressure regulation-full premixed combustion system is disposed in the combustion chamber.

18. A fuel oil thermoelectric power generating device comprising the fuel oil provision-vaporization-pressure regulation-full premixed combustion system according to claim 7, further comprising a power generating device;
wherein the power generating device comprises a combustion chamber, a thermoelectric power generation module and a heat pipe radiator; the heat pipe radiator comprises an evaporator, a heat pipe and a cooler;
the thermoelectric power generation module is disposed between the combustion chamber and the evaporator, the evaporator is in communication with the cooler through the heat pipe;
the thermoelectric power generation module is connected with a load through a conductor; the full premixed combustor of the fuel oil provision-vaporization-pressure regulation-full premixed combustion system is disposed in the combustion chamber.

19. A method for generating power by means of the fuel oil thermoelectric power generating device according to claim 9, comprising the following steps of:
1) issuing, by the microcontroller, instructions that the preheater preheats the vaporizing chamber and the high temperature pressure regulating valve;
2) activating the air pump to keep the fuel tank at the pressure of between 0.06 and 0.10 MPa when the temperatures of the vaporizing chamber and the high temperature pressure regulating valve reach between 130 and 270° C.;
3) turning on the electronic control valve on the second conduit, so that the internal pressure of the fuel tank forces the fuel oil to enter the vaporizing chamber by an amount of between 0.35 and 0.4 ml each time and the fuel oil becomes high pressured vaporized gas;
4) passing the high pressured vaporized gas in the vaporizing chamber through the high temperature pressure regulating valve, so that the high pressured vaporized gas becomes vaporized gas of fuel oil at constant pressure of between 0.08 and 0.12 MPa and enters the premix nozzle;
passing the air through the air intake ports of the premix nozzle into the full premixed combustor together with the vaporized gas of fuel oil through the intake guiding device;
wherein the volume ratio of the vaporized gas of fuel oil through the premix nozzle and the sum of the air coming through the air intake ports and the air coming through the intake guiding device is 1:14-1:16;
5) igniting mixed gas of the vaporized gas of fuel oil and the air by the ignition device and causing the mixed gas to burn sufficiently in the combustion chamber after the vaporized gas of fuel oil entering the full premixed combustor at high speed together with the air;
6) outputting, by the thermoelectric power generation module, electric energy continuously.

20. A method for generating power by means of the fuel oil thermoelectric power generating device according to claim 10, comprising the following steps of:
1) issuing, by the microcontroller, instructions that the preheater preheats the vaporizing chamber and the high temperature pressure regulating valve;
2) activating the air pump to keep the fuel tank at the pressure of between 0.06 and 0.10 MPa when the temperatures of the vaporizing chamber and the high temperature pressure regulating valve reach between 130 and 270° C.;
3) turning on the electronic control valve on the second conduit, so that the internal pressure of the fuel tank forces the fuel oil to enter the vaporizing chamber by an amount of between 0.35 and 0.4 ml each time and the fuel oil becomes high pressured vaporized gas;
4) passing the high pressured vaporized gas in the vaporizing chamber through the high temperature pressure regulating valve, so that the high pressured vaporized gas becomes vaporized gas of fuel oil at constant pressure of between 0.08 and 0.12 MPa and enters the premix nozzle;

passing the air through the air intake ports of the premix nozzle into the full premixed combustor together with the vaporized gas of fuel oil through the intake guiding device;

wherein the volume ratio of the vaporized gas of fuel oil through the premix nozzle and the sum of the air coming through the air intake ports and the air coming through the intake guiding device is 1:14-1:16;

5) igniting mixed gas of the vaporized gas of fuel oil and the air by the ignition device and causing the mixed gas to burn sufficiently in the combustion chamber after the vaporized gas of fuel oil entering the full premixed combustor at high speed together with the air;

6) outputting, by the thermoelectric power generation module, electric energy continuously.

* * * * *